(12) United States Patent
Sul et al.

(10) Patent No.: US 9,024,675 B2
(45) Date of Patent: May 5, 2015

(54) MULTI POWER SUPPLY TYPE LEVEL SHIFTER

(71) Applicant: MagnaChip Semiconductor, Ltd., Cheongju-si (KR)

(72) Inventors: Jung Hoon Sul, Seoul (KR); Brandon Kwon, Seoul (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/223,455

(22) Filed: Mar. 24, 2014

(65) Prior Publication Data

US 2014/0375373 A1    Dec. 25, 2014

(30) Foreign Application Priority Data

Jun. 21, 2013  (KR) .......................... 10-2013-0071941

(51) Int. Cl.
*H03L 5/00* (2006.01)
*H03K 19/0185* (2006.01)

(52) U.S. Cl.
CPC .............................. *H03K 19/018507* (2013.01)

(58) Field of Classification Search
None
See application file for complete search history.

(56) References Cited

U.S. PATENT DOCUMENTS

| 6,373,285 B1 * | 4/2002 | Konishi ........................ 326/81 |
| 6,785,107 B1 | 8/2004 | Schmitt |
| 7,005,908 B2 * | 2/2006 | Lee et al. ...................... 327/333 |

* cited by examiner

*Primary Examiner* — Long Nguyen
(74) *Attorney, Agent, or Firm* — NSIP Law

(57) ABSTRACT

There is provided a multi power supply type level shifter. The provided multi power supply type level shifter includes a first level shifter and a second level shifter in a two-stage architecture so as to selectively receive first to third power supplies and change a signal level, even when the first to third power supplies are applied in a different sequence from a normal power-on sequence. Output voltages are output without a change in level, and short-circuit currents are not generated in the first and second level shifters.

25 Claims, 12 Drawing Sheets

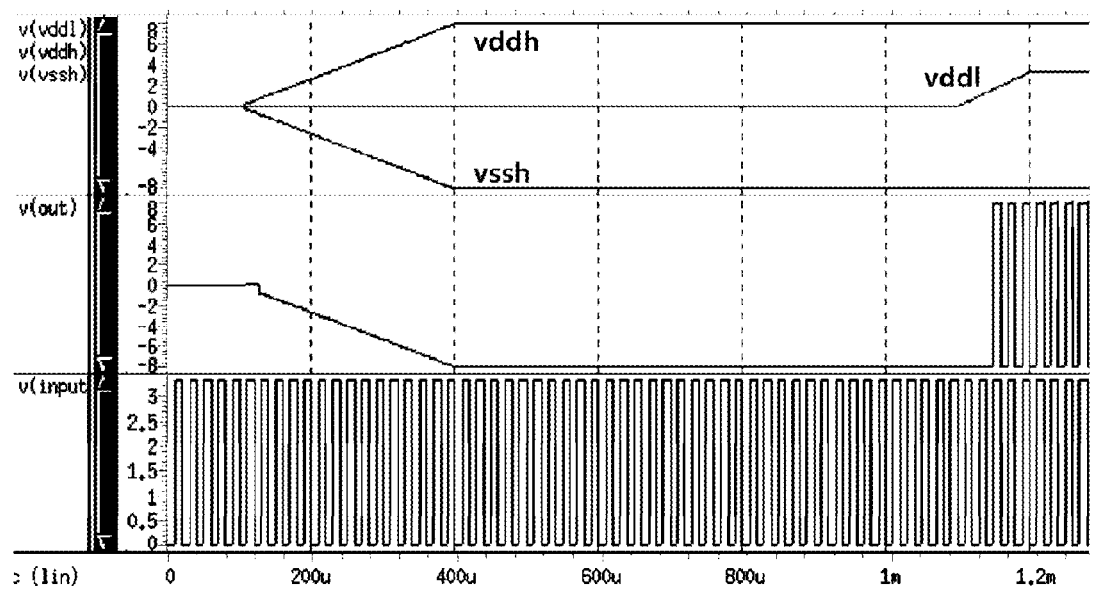

MULTI POWER SUPPLY TYPE LEVEL SHIFTER

CROSS-REFERENCE TO RELATED APPLICATIONS

This application claims the priority of Korean Patent Application No. 10-2013-0071941 filed on Jun. 21, 2013, in the Korean Intellectual Property Office, the entire disclosure of which is incorporated herein by reference for all purposes.

BACKGROUND

1. Field

The following description relates to a level shifter. The following description also relates to a multi power supply type level shifter configured as a two-stage level shifter, each stage having four MOS transistors to constantly output voltages at a constant level regardless of a power-on sequence.

2. Description of Related Art

In order for general memory circuits or various integrated circuit (IC) circuits to operate normally, an appropriate voltage needs to be applied to the circuit. Most semiconductor integrated circuits include several circuit blocks for executing various functions, and there are various power supply voltages for driving these circuit blocks. Accordingly, the circuit blocks use a level shifter to change a voltage level in order to successfully interface between the respective circuit blocks.

For example, such a level shifter is used in a display driver IC (DDI) such as a driving IC for driving a panel of an organic light-emitting diode (OLED) or a liquid crystal diode (LCD). These ICs enable a plurality of power supplies to be sequentially supplied to the level shifter to correspond to a power-on sequence. By providing power in this manner, it allows a series of image data items to be displayed on a screen while appropriately changing a signal level.

Typically, a power supply voltage applied to the level shifter included in the IC includes a first power supply (VDDL) and a second power supply (VDDH) as power-on voltages and a third power supply (VSSH) as a ground voltage (GND). However, the ground voltage (VSSH) may not have a '0' level. In an example, the VSSH has a 'minus (−)' value, and the first power supply (VDDL) has a '0' value. In this example, the second power supply (VDDH) has a power supply voltage that is higher than the first and third power supplies.

The power supply voltages are applied in a two-stage level shifter in a predetermined sequence. In the sequence, the power supply voltages are applied in a specific sequence, such as of VDDL->VSSH->VDDH.

However, sometimes an error may occur the power supply voltages are not applied in the predetermined sequence due to a fault in system design or unintentional factors caused by external noise at the time of system operation.

Thus, there are issues that levels of output voltages of the level shifter are not constant and various circuit devices constituting the level shifter are potentially physically damaged by short-circuit currents generated by improperly activated operations of MOS transistors.

A situation where issues result from a change in a supply sequence of the power supply voltages is described with reference to FIG. 1. FIG. 1 is an example of a circuit configuration diagram showing a level shifter having a multi power supply structure.

In the circuit configuration diagram described below, a metal-oxide semiconductor (MOS) transistor is referred to as a PM or NM depending on whether the MOS transistor is a P-type or N-type. A MOS transistor is a transistor used for amplifying or switching electronic signals by providing a conducting channel that includes carriers to transmit the signal. In an N-type MOS transistor, the carriers are electrons, and in a P-type MOS transistor the carriers are holes.

As shown in FIG. 1, a level shifter 10 includes a first level shifter 20 and a second level shifter 30 each having four MOS transistors. In each level shifter, two of the MOS transistors are P-type MOS transistors, and two of the MOS transistors are N-type MOS transistors. Here the level shift 10 is a two-stage level shifter.

The first level shifter 20 includes a PM 1 and a PM 2 that respectively receive an input voltage IN. The first level shifter 20 also receives an input voltage INb inverted by an inverter 2 and a NM 1 and a NM 2 that act as a latch circuit for pulling-down the input voltage IN.

Gates of the PM 1 and the PM 2 are respectively connected to the input voltage IN and the inverted input voltage IN b. The sources of the PM 1 and the PM 2 are connected to a first power supply (VDDL). Drains of the PM 1 and the PM 2 are respectively connected to a node a and a node b to be connected to the NM 1 and NM 2 as a latch circuit.

Gates and drains of the NM 1 and the NM 2 constituting a latch circuit are cross-connected between the node a and the node b. The sources of the NM 1 and the NM 2 are connected to a third power supply (VSSH). V1 and V2 represent voltage potentials of the node a and the node b. V1 and V2 are connected to the second level shifter 30.

The second level shifter 30 includes a NM 3 and a NM 4 that receive the V1 and the V2 and latch circuits PM 3 and PM 4 that act as pull-up devices.

Gates of the NM 3 and the NM 4 receive the V1 and the V2, respectively. Sources of the NM 3 and the NM 4 are connected to the third power supply (VSSH). Drains of the NM 3 and the NM 4 are respectively connected to a node c and a node d to be connected to the PM 3 and the PM 4.

Thus, gates and drains of the PM 3 and the PM 4 are cross-connected to the node c and the node d, and the sources of the PM 3 and the PM 4 are connected to the second power supply (VDDH).

A case in which the first power supply (VDDL) is not applied in such a two-stage level shifter of a multi power supply type is described as an example.

When the first power supply (VDDL) is not applied, gate potentials of the NM 1 and the NM 2 enter a ground (GND) state or a floating state of a ground (GND) level.

As a result of this situation, the PM 1 and the PM 2 that are connected to the node a and the node b are turned on. All MOSs of the first level shifter 10 are turned on in this situation, and thus current paths from the PM 1 and the PM 2 to the NM 1 and the NM 2 are formed in the first level shifter 10 that cause a short-circuit current.

Similarly, when the voltage potentials V1 and V2 of the node a and the node b become potentials for turning on the NM 3 and the NM 4, the PM 3 and the PM 4 are also turned on. Thus, current paths from the PM 3 and the PM 4 to the NM 3 and the NM 4 are formed in such a situation that generate a short-circuit current.

Additionally, the level shifter 10 includes a PM 5 and a NM 5. The PM 5 and the NM 5 serving as inverters that form an output terminal of the second level shifter 30 are also turned on by a voltage potential V4 on a node that connects the PM 4 and the NM 4. Thus, a short-circuit current flows through the NM 5 from the PM 5.

Based on the issues just discussed, the level shifter 10 potentially does not operate as designed due to an unintentional current in the level shifter 10, such as a short-circuit current. In some cases, when the amount of short-circuit current is large, various devices constituting the level shifter, that is, the MOSs themselves, are physically damaged.

Accordingly, when the level shifter 10 encounters such a situation, the output voltage level is changed in a manner contrary to the design of the level shifter 10.

Similar issues are also caused when the second power supply (VDDH) is applied before the third power supply (VSSH) is applied.

In the aforementioned level shifter 10, current flow states between the PM 5 and the NM 5 depending on a power-on sequence of the VDDL, VDDH, and VSSH are defined in Table 1, and are also illustrated with reference to FIG. 2. FIG. 2 is a diagram illustrating a generating region corresponding to a short-circuit current of the level shifter 10 shown in FIG. 1.

TABLE 1

| Power-on state | | | Node voltage | | | | | |
|---|---|---|---|---|---|---|---|---|
| VDDL | VDDH | VSSH | V1 | V2 | V3 | V4 | OUT | SCC |
| GND | GND | P-O | F | F | T | T | T | Yes |
| GND | P-O | GND | F | F | T | T | T | Yes |
| GND | P-O | P-O | F | F | T | T | T | Yes |
| P-O | GND | P-O | H/L | L/H | L/H | H/L | L/H | No |
| P-O | P-O | GND | H/L | L/H | L/H | H/L | L/H | No |

In Table 1, various combinations of possible power-on states for VDDL, VDDH, and VSSH are presented. The power-on states are represented by Ground (GND) or Power-On (P-O). Based on the power-on states, Table 1 presents corresponding node voltages for V1, V2, V3, V4, and OUT. The node voltages are represented by Floating (F), Transition (T), High or Low (H/L), or Low or High (L/H). The SCC column is a group of entries that indicate whether there is a short-circuit current of inverters PM 5 and NM 5, based on the other columns.

When the VDDL is applied, since the current flow is blocked, a short-circuit current is not generated. Meanwhile, when the VDDL is grounded and the VDDH or the VSSH is applied, a short-circuit current is generated between the PM 5 and the NM 5.

In approaches, in order to avoid the short-circuit current, a power supply unit in which a power-on sequence is previously determined is separately provided. However, in such an approach, a circuit configuration of the power supply unit becomes more complicated.

SUMMARY

Examples provide a multi power supply type level shifter configured to output an output voltage of a preset voltage level regardless of a power-on sequence.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multi power supply type level shifter includes a first level shifter situated between a first power supply and a third power supply and configured to output a first voltage level and a second voltage level through a node a and a node b, respectively, depending on an input signal, a second level shifter situated between a second power supply and the third power supply and configured to output a third voltage level and a fourth voltage level through a node c and a node d, respectively, depending on the first voltage level and the second voltage level, and a detecting unit configured to detect whether the third power supply is applied to the first level shifter before the first power supply is applied, wherein in response to the third power supply being applied before the first power supply is applied, the detecting unit is configured to cause the first voltage level of the node a and the second voltage level of the node b to enter a high-level state and a low-level state, respectively.

In response to the second power supply being applied to the second level shifter, the node c and the node d may be configured to enter a low-level state and a high-level state depending on the first voltage level and the second voltage level, respectively.

The multi power supply type level shifter may further include an output unit configured to receive a fourth voltage level in the high-level state from the node d, inverts a state of the received fourth voltage level to a low-level state, and configured to output the fourth voltage level in the low-level state.

The detecting unit may include a plurality of switching devices that are maintained at a turned-off state in response to the third power supply being applied and are turned on depending on the second voltage level of the node b.

The detecting unit may further include a first metal-oxide semiconductor (MO) configured to detect the second voltage level of the node b, a second MOS that is connected to the first MOS and has a gate voltage of a ground (GND) level, and a third MOS that is connected to the second MOS and is pull-up driven so as to allow the node a to enter a high-level state in response to the first MOS and the second MOS being turned on.

The first MOS and the second MOS may be turned on in response to the second voltage level of the node b being equal to or greater than a threshold value of the first MOS.

Among the first power supply, the second power supply and the third power supply, the second power supply may have the highest voltage level, and the third power supply may have the lowest voltage level.

The first power supply may be a lower supply voltage VDDL, the second power supply may be a higher supply voltage VDDH, and the third power supply may be a reference voltage VSSH.

In another general aspect, a multi power supply type level shifter includes a first level shifter situated between a first power supply and a third power supply and configured to output a first voltage level and a second voltage level through a node a and a node b, respectively, depending on an input signal, a second level shifter situated between a second power supply and the third power supply and configured to output a third voltage level and a fourth voltage level through a node c and a node d, respectively, depending on the first voltage level and the second voltage level, and a detecting unit configured to detect whether the second power supply is applied to the second level shifter before the third power supply is applied, wherein in response to the second power supply being applied before the third power supply is applied, the detecting unit is configured to cause the third voltage level of the node c and the fourth voltage level of the node d to enter a low-level state and a high-level state, respectively.

The multi power supply type level shifter may further include an output unit configured to receive the fourth voltage level in the high-level state through the node d, inverts a state of the received fourth voltage level to a low-level state, and configured to output the fourth voltage level in the low-level state.

The detecting unit may include a first P-type metal oxide semiconductor (PMOS) that is connected to the node d, a second PMOS that is connected to the first PMOS and has a gate voltage of a ground (GND) level, and a first N-type metal oxide semiconductor (NMOS) that is connected to the second PMOS and is pull-down driven so as to allow the node c to enter a low-level state in response to the first PMOS and the second PMOS being turned on.

In response to the third voltage level of the node c being equal to or less than a threshold value of the first PMOS, the first PMOS, the second PMOS and the first NMOS may be turned on.

Among the first power supply, the second power supply and the third power supply, the second power supply may have the highest voltage level, and the third power supply may have the lowest voltage level.

The first power supply may be lower supply voltage VDDL, the second power supply may be a higher supply voltage VDDH, and the third power supply may be a reference voltage VSSH.

In another general aspect, a multi power supply type level shifter including a first level shifter and a second level shifter in two stages that selectively receive first, second, and third power supplies and change a signal level includes a first detecting unit configured to detect that the first power supply is applied when the third power supply is previously applied to the first level shifter and in response, configured to cause the first level shifter to output a first voltage level in a high-level state and a second voltage level in a low-level state, and a second detecting unit configured to detect that third power supply is applied when the second power supply is previously applied to the second level shifter and in response, configured to cause the second level shifter to output a third voltage level in a low-level state and a fourth voltage level in a high-level state.

The first power supply may be a lower supply voltage VDDL, the second power supply may be a higher supply voltage VDDH, and the third power supply may be a reference voltage VSSH.

The first detecting unit may include a plurality of switching devices that are maintained in a turned-off state in response to the third power supply being applied and are turned on depending on the second voltage level of a node b.

The second detecting unit may include a first metal-oxide semiconductor (MOS) configured to detect the second voltage level of the node b, a second MOS that is connected to the first MOS and has a gate voltage of a ground (GND) level, and a third MOS that is connected to the second MOS and is pull-up driven to allow a node a to enter a high-level state in response to the first MOS and the second MOS being turned on, and the first MOS and the second MOS may be turned on in response to the second voltage level of the node b being equal to or greater than a threshold value of the first MOS.

The second detecting unit may include a first PMOS that is connected to a node d, a second PMOS that is connected to the first PMOS and has a gate voltage of a ground (GND) level, and a first NMOS that is connected to the second PMOS and is pull-down driven so as to allow a node c to enter a low-level state in response to the first PMOS and the second PMOS being turned on.

In response to the third voltage level of the node c being equal to or less than a threshold value of the first PMOS, the first PMOS, the second PMOS and the first NMOS may be turned on.

At least one of the first level shifter and the second level shifter may be configured to execute a self-bias function.

In another general aspect, a multi power supply type level shifter includes a first level shifter situated between a first power supply and a third power supply configured to output a first voltage level and a second voltage level, depending on an input signal, a second level shifter situated between a second power supply and the third power supply configured to output a third voltage level and a fourth voltage level, depending on the first voltage level and the second voltage level, and a detecting unit configured to detect when a power supply is applied out of order, wherein in response to detecting that a power supply is applied out of order, the detecting unit is configured to control one or more of the first voltage level, the second voltage level, the third voltage level, and the fourth voltage level.

In response to detecting that the third power supply being applied before the first power supply is applied, the detecting unit is configured to cause the first voltage level and the second voltage level to enter a high-level state and a low-level state, respectively.

In response to detecting that the second power supply being applied before the third power supply is applied, the detecting unit is configured to cause the third voltage level and the fourth voltage level to enter a low-level state and a high-level state, respectively.

The multi power supply type level shifter may further include an output unit configured to receive the fourth voltage level in the high-level state, inverts a state of the received fourth voltage level to a low-level state, and configured to output the fourth voltage level in the low-level state.

Other features and aspects will be apparent from the following detailed description, the drawings, and the claims.

BRIEF DESCRIPTION OF THE DRAWINGS

FIGS. 7A to 7B are simulation results when the third power supply VSSH and the second power supply VDDH are simultaneously applied according to the example.

Figure 1:
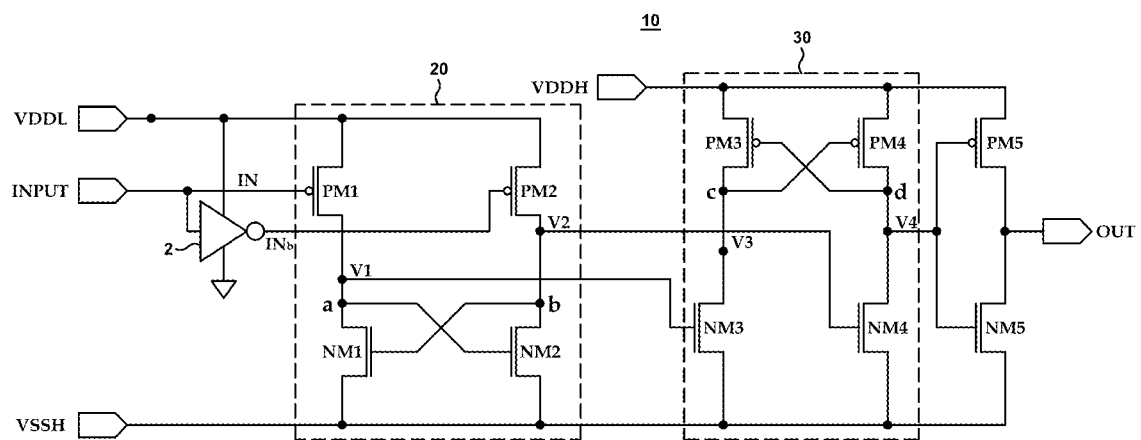
FIG. 1 is a circuit configuration diagram illustrating a level shifter having a multi power supply structure.
Figure 2:
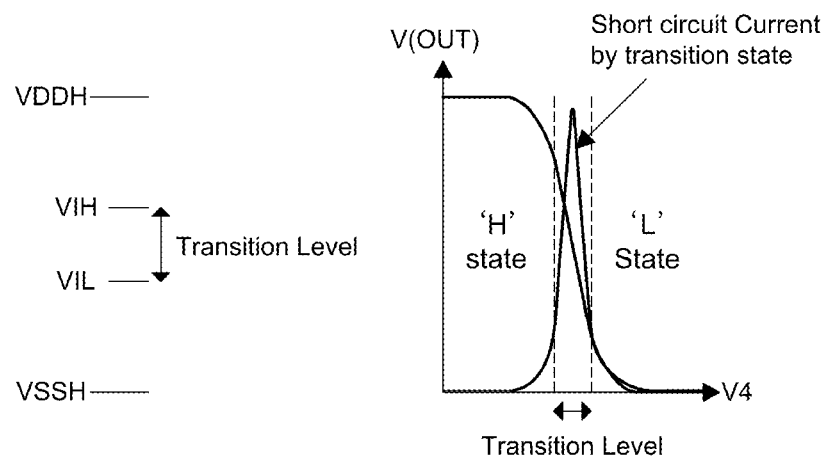
FIG. 2 is a diagram illustrating a generating region of a short-circuit current of the level shifter shown in FIG. 1.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the following description, letters are used to represent nodes. The letters are not used to indicate any ordering or relationship between the nodes, and are merely used to help identify the respective nodes to explain their role in the circuits to which they belong.

Accordingly, in a stable system, the two-stage level shifter prevents a short-circuit current from being generated and to constantly output an output voltage level even when the power-on sequence is changed, for example, even when the first power supply VDDL is not applied or the second power supply VDDH is applied before the third power supply VSSH is applied.

As discussed above, a multi power supply type level shifter according to the examples exhibits the capability to prevent a short-circuit current from being generated and to constantly output an output voltage level even when the power-on sequence is changed.

That is, in a multi power supply type level shifter that operates using a normal power-on sequence of VDDL, VSSH, and VDDH, because even when the power supplies are applied in a sequence that differs from the normal power-on sequence an output voltage is constantly output at a constant level, such a level shifter has improved reliability.

Additionally, in examples, MOS devices constituting a first level shifter and a second level shifter are prevented from being simultaneously turned on, so examples prevent the devices from being damaged due to short-circuit currents.

The present example provides a capability for a two-stage level shifter using multiple power supplies, that when a VDDL power supply that is designated to be firstly applied is not applied, even when a VDDH power supply having a potential relatively higher than the VDDL power supply or a VSSH power supply having a potential relatively lower than the VDDL power supply is firstly applied, an output voltage is still constantly maintained while preventing a short-circuit current.

A multi power supply type level shifter according to examples providing such a capability is described with reference to the accompanying drawings.

In the following description of the examples, the corresponding MOS devices as those in the presented in the approach of FIG. 1 will be denoted by the same reference numerals used in FIG. 1. That is, the present example includes configurations of a first level shifter and a second level shifter each having four MOS transistors, and thus MOS devices constituting the first level shifter and the second level shifter are denoted by the same reference numerals as those in FIG. 1. However, the multi power supply type level shifter, the first level shifter and the second level shifter are denoted by different reference numerals.

Figure 3:
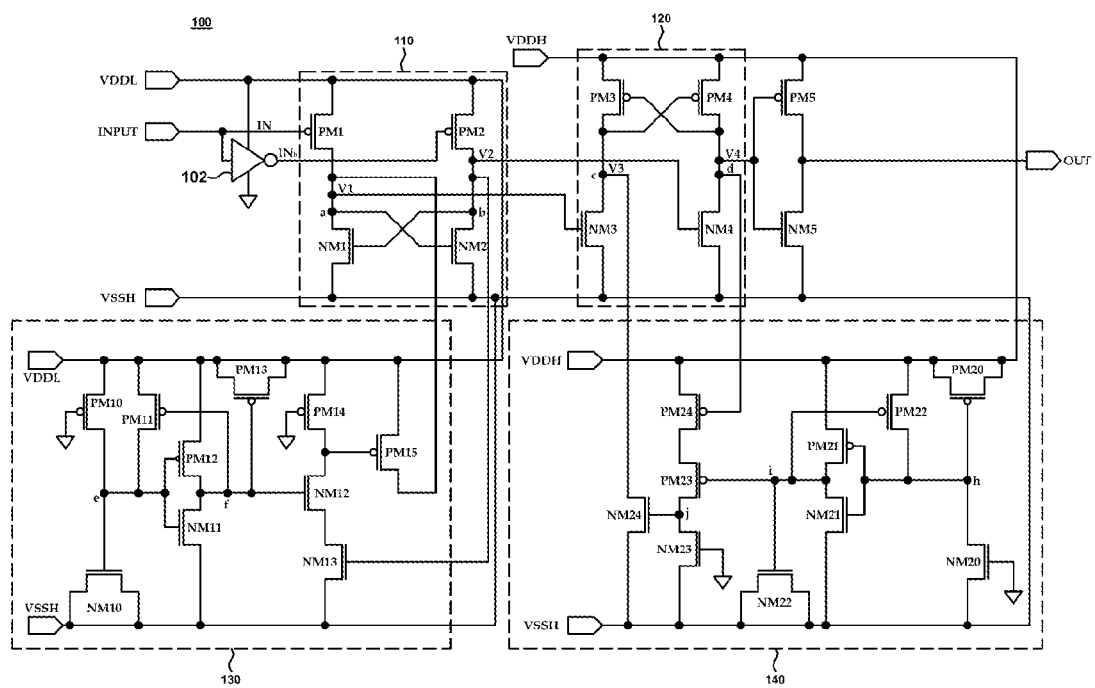
FIG. 3 is a circuit configuration diagram of a multi power supply type level shifter according to an example.

FIG. 3 is a circuit configuration diagram of a multi power supply type level shifter according to an example.

As shown in the drawing, a multi power supply type level shifter 100 includes a first level shifter 110 and a second level shifter 120.

The first shifter 110 includes a PM 1 and a PM 2 that receive an input voltage IN and an input voltage INb inverted by an inverter 102, respectively. The first shifter 110 also includes a NM 1 and a NM 2 that act as latch circuits for pull-down driving.

Gates of the PM 1 and the PM 2 are respectively connected to the input voltage IN and the inverted input voltage INb, the sources of the PM 1 and the PM 2 are connected to a first power supply (VDDL), and the drains of the PM 1 and the PM 2 are respectively connected to a node a and a node b to be respectively connected to the NM 1 and the NM 2. Additionally, gates and drains of the NM 1 and the NM 2 are cross-connected to the node a and the node b. The sources of the NM 1 and the NM 2 are connected to a third power supply (VSSH).

Voltage potentials V1 and V2 of the node a and the node b are connected to the second level shifter 120. The second level shifter 120 includes a NM 3 and a NM 4 that receive the V1 and the V2. The second level shifter 120 also includes a PM 3 and a PM 4 that serve as latch circuits for pull-up driving.

Gates of the NM 3 and the NM 4 receive the V1 and V2, respectively. The sources of the NM 3 and the NM 4 are connected to the third power supply (VSSH). The drains of the NM 3 and the NM 4 are connected to a node c and a node d, respectively, to be connected to the PM 3 and the PM 4.

Furthermore, the gates and the drains of the PM 3 and the PM 4 are cross-connected between the node c and the node d. The sources of the PM 3 and the PM 4 are connected to a second power supply (VDDH).

Meanwhile, in the present example, the node a through the node d are set to have constant levels. By keeping the node a through the node d at constant levels, the generation of a short-circuit current through a MOS device is prevented and levels of output voltages are stably output.

To achieve constant levels for the node a through the node d, a first detecting unit 130 and a second detecting unit 140 that detect whether or not the first power supply (VDDL) and the third power supply (VSSH) are applied are respectively provided for the first level shifter 110 and the second level shifter 120. That is, when the first power supply (VDDL) is not applied, the first detecting unit 130 enables the node a to be maintained at a level relatively higher than that of the node b. Moreover, when the second power supply (VDDH) is applied before the third power supply (VSSH) is applied, the second detecting unit enables the node c to be maintained at a level relatively lower than that of the node d. By maintaining these relationships between the node levels, the example achieves the effects discussed above.

Next, the configurations of the first detecting unit 130 and the second detecting unit 140 are described.

The configuration of the first detecting unit 130 is as follows.

First, the first detecting unit 130 includes a PM 10 in which a source is connected to the first power supply (VDDL). The gate of PM 10 is grounded, and a drain of PM 10 is connected to a node e. The first detecting unit 130 also includes a PM 11 in which a source is connected to the first power supply (VDDL). The gate of PM 11 is connected to an output node f of an inverter device to be described further below, and a drain of PM 11 is connected to the node e. Further, the first detecting unit 130 includes a NM 10 in which a gate is connected to the node e. A drain and a source of NM 10 are connected to the third power supply (VSSH). Here, the PM 10 and the NM 10 serve as resistor-capacitor (RC) circuits.

In addition, the first detecting unit 130 includes a PM 12 and a NM 11, provided as inverter devices. The gates of the PM 12 and the NM 11 are connected to the node e. A source of the PM 12 is connected to the first power supply (VDDL), and a source of the NM 11 is connected to the third power supply (VSSH). Drains of the PM 12 and the NM 11 are connected to each other to be connected to the node f.

Further, the first detecting unit 130 includes a PM 13 in which a gate is connected to the node f. A drain and a source of PM 13 are connected to the first power supply (VDDL).

Furthermore, the first detecting unit 130 includes a NM 12 in which a gate is connected to the node f. A drain of the NM 12 is connected to a NM 13 that is turned on depending on a voltage level of the node b. That is, a drain of the NM 13 is connected to the drain of the NM 12, a source of the NM 13 is connected to the third power supply (VSSH), and a gate of the NM 13 is connected to the node b. The NM 13 is turned on based on the voltage level of the node b, so that the voltage potential V1 of the node a is set to be higher than the voltage potential V2 of the node b.

In addition, a source of the NM 12 is connected to a PM 14 and a PM 15. A gate of the PM 14 is grounded. A source of the PM 14 is connected to the first power supply (VDDL). Also, a source of the PM 15 is connected to the first power supply (VDDL), and a drain of the PM 15 is connected to the node a. Such a PM 15 operates as a pull-up driving device when the NM 12 and the NM 13 are turned on, to allow the node a to enter a high-level state.

The configuration of the second detecting unit 140 is as follows.

The second detecting unit 140 includes a PM 20 in which a drain and a source are connected to the second power supply (VDDH). A gate of PM 20 is connected to a node h. Additionally, the second detecting unit 140 includes a NM 20 in which a drain is connected to the node h, a source is connected to the third power supply (VSSH), and a gate is grounded.

The second detecting unit 140 includes a PM 21 and a NM 21 as inverter devices. The gates of the PM 21 and the NM 21 are connected to the node h. A source of the PM 21 is connected to the second power supply (VDDH), and a source of the NM 21 is connected to the third power supply (VSSH). Also, drains of the PM 21 and the NM 21 are connected to each other.

The second detecting unit 140 includes a PM 22 that receives output signals of the PM 21 and the NM 21 through a gate to turn the PM 22 on or off. In this example, a source of the PM 22 is connected to the second power supply (VDDH) and a drain thereof is connected to input terminals of the PM 21 and the NM 21.

The second detecting unit 140 includes a NM 22 that is connected to a node i serving as an output node of the PM 21 and the NM 21. A drain and a source of the NM 22 are each connected to the third power supply (VSSH).

The second detecting unit 140 includes a PM 23 in which a gate is connected to the node i. A source of the PM 23 is connected to a PM 24, and a drain of the PM 23 is connected to a NM 23 and a NM 24. A source of the PM 24 is connected to the second power supply (VDDH). A gate of the PM 24 is connected to the node d. Further, a gate of the NM 23 is grounded, and a source of the NM 23 is connected to the third power supply (VSSH).

Moreover, a gate of the NM 24 is connected to a node j that connects the PM 23 and the NM 23. A drain of the NM 24 is connected to the node c, and a source of the NM 24 is connected to the third power supply (VSSH). When the PM 23 and the PM 24 are turned on, depending on the voltage level of the node d, the NM 24 operates as a pull-down driving device to allow the node c to enter a low-level state.

Next, the operation of the multi power supply type level shifter having the configuration described above is explained.

Figure 4A:
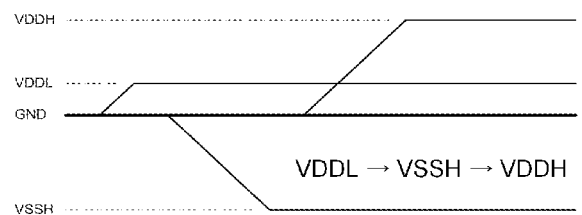
FIGS. 4A, 4B, and 4C are power-on sequence timing charts illustrating a power-on sequence according to an example.

First, in a power-on sequence shown in FIG. 4A, the level shifter 100 having a two-stage structure follows a normal power-on sequence of the first power supply (VDDL), the third power supply (VSSH), and the second power supply (VDDH).

In the examples, the third power supply (VSSH) or the second power supply (VDDH) is applied before the first power supply (VDDL) of the multi power supply type level shifter is applied. However, the output voltages are still constantly output at a constant level. A case where the third power supply (VSSH) is applied before the second power supply (VDDH) is applied and a case where the second power supply (VDDH) is applied before the third power supply (VSSH) is applied are now described, below.

First, a case where the third power supply (VSSH) is applied, and then the second power supply (VDDH) and the first power supply (VDDL) are sequentially applied is explained. Such a power-on sequence is illustrated in FIG. 4B.

Figure 4B:
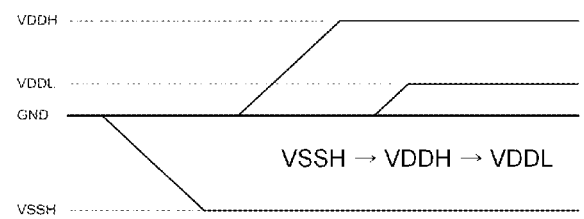

As shown in FIG. 4B, when the third power supply (VSSH) is applied before the first power supply (VDDL) of a ground level is applied, the voltage level of the node e increases to enter a high-level state. Further, the high-level voltage state is changed to a low-level state at the node f as a result of the PM 12 and the NM 11 serving as inverter devices.

Thus, the gate of the NM 12 is maintained at a turned-off state of a ground level. Simultaneously, the PM 14 and the NM 13 that are connected to the NM 12 are maintained at a turned-off state.

In this state, when the level of the node b of the first level shifter 110 is equal to or greater than a preset threshold value of the NM 13, the NM 12 and the NM 13 are turned on. Accordingly, the PM 15 is turned on, as well.

When the PM 15 is turned on, the PM 15 is pull-up driven, and the node a connected to the PM 15 enters a high-level state.

When the node a is in the high-level state, the NM 2 connected to the node a is turned on. The level of the node b connected to the drain of the NM 2 is lowered up to a level of the third power supply (VSSH), and thus the node b enters a low-level state.

As described above, when the third power supply (VSSH) is initially applied, the NM 13 of the first detecting unit 130 is selectively turned on depending on the voltage potential V2 of the node b. Thus, the PM 15 connected to the node a is pull-up driven. Accordingly, the node a and the node b are set to be in a high-level state and a low-level state, respectively.

Meanwhile, when the second power supply (VDDH) is applied while the node a and the node b are set, the NM 3 and the PM 3 are turned on depending on the level states of the node a and the node b. Also, the NM 4 and the PM 4 are turned off. Accordingly, the node c corresponding to the V3 enters a low-level state, and the node d corresponding to the V4 enters a high-level state. As a result, short-circuit currents are not generated.

Since the node c and the node d enter preset level states, a voltage level of the V4 is output in a low-level state, because the PM 5 and the NM 5 serve as inverters.

Second, a case where the second power supply (VDDH) is applied before the third power supply (VSSH) is applied is described. A power-on sequence in such a case is illustrated in FIG. 4C.

Figure 4C:
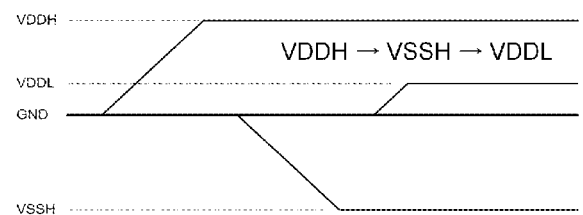

As shown in FIG. 4C, when the second power supply (VDDH) is applied before the third power supply (VSSH) is applied, the first power supply (VDDL) and the third power supply (VSSH) are all in a ground-level state.

Accordingly, the voltage potentials V1 and V2 corresponding to the node a and the node b are in a unknown state where potentials thereof are unknown or in a ground (GND)-level state. Hence, the NM 23 and the NM 24 are in a turned-off state.

When the NM 23 and the NM 24 are in a turned-off state, the gate of the PM 23 connected to the NM 23 and the NM 24 has a ground (GND) level. Thus, as described above, when the second power supply (VDDH) is initially applied, the NM 23 and the NM 24 are in a turned-off state, and the PM 23 and the PM 24 are all in a turned-off state.

In this state, when the voltage potential V4 corresponding to the node d is equal to or less than a preset threshold value of the PM 24, the PM 24, the PM 23 and the NM 24 are all in a turned-on state. Thus, the NM 24 is pull-down driven, to set the potential V3 corresponding to the node c up to a ground-level.

When the node c is in a relatively low-level state, the PM 4 connected to the node c through the gate is turned on, and the V4 corresponding to the node d has a high level. That is, the voltage level of the V4 increases up to a level of the second power supply (VDDH).

When the second power supply is applied before the third power supply is applied, the PM 24 of the second detecting unit 140 is turned on depending on the voltage potential V4 of the node d to pull-down drive the NM 24, so that the V3 connected to the node c is set to be a low level. In addition, the PM 4 is turned on to set the voltage level of the V4 of the node d to be a high level.

Accordingly, by turning on only the PM 4 among the MOS devices of the second level shifter 120, since a current path through the NM 4 is not formed, a short-circuit current is not generated.

The voltage level of the V4 in the high-level state is output in a low-level state by being inverted because the PM 5 and the NM 5 serve as inverters.

As explained, even when the third power supply (VSSH) and the second power supply (VDDH) are applied before the first power supply (VDDL) is applied, because a portion of the MOS devices of the first and second level shifters is turned on, it prevents short-circuit current from being generated. Further, the output voltages finally output by the level shifter all have the same voltage level in a low-level state.

Meanwhile, the operation of the level shifter, of examples, that constantly outputs output voltages in a low-level state regardless of a power-on sequence is illustrated through simulation results.

Figure 5A:
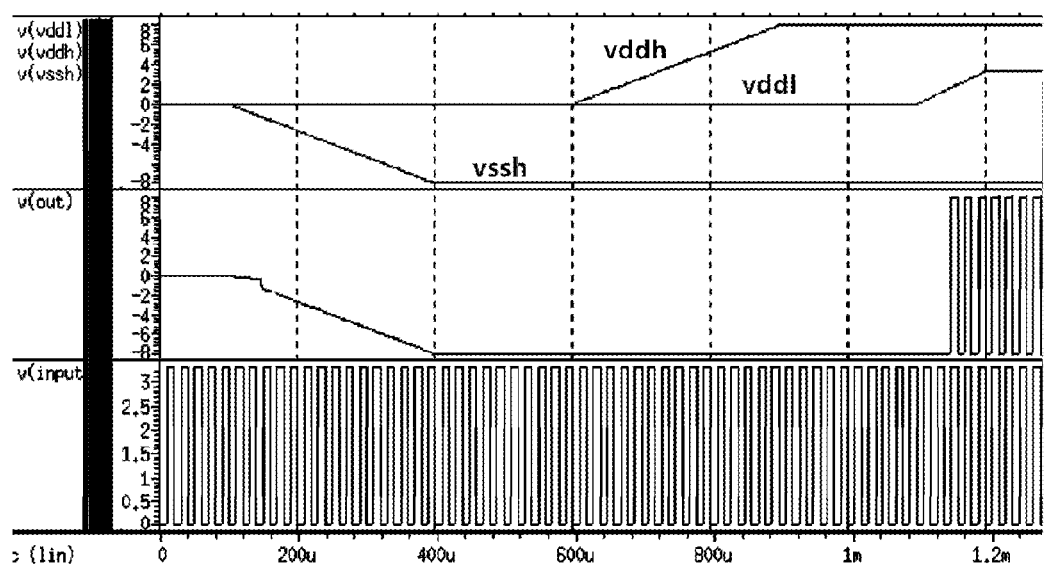
FIGS. 5A and 5B are simulation results when a third power supply VSSH, a second power supply VDDH, and a first power supply VDDL are sequentially applied according to the example.
Figure 5B:
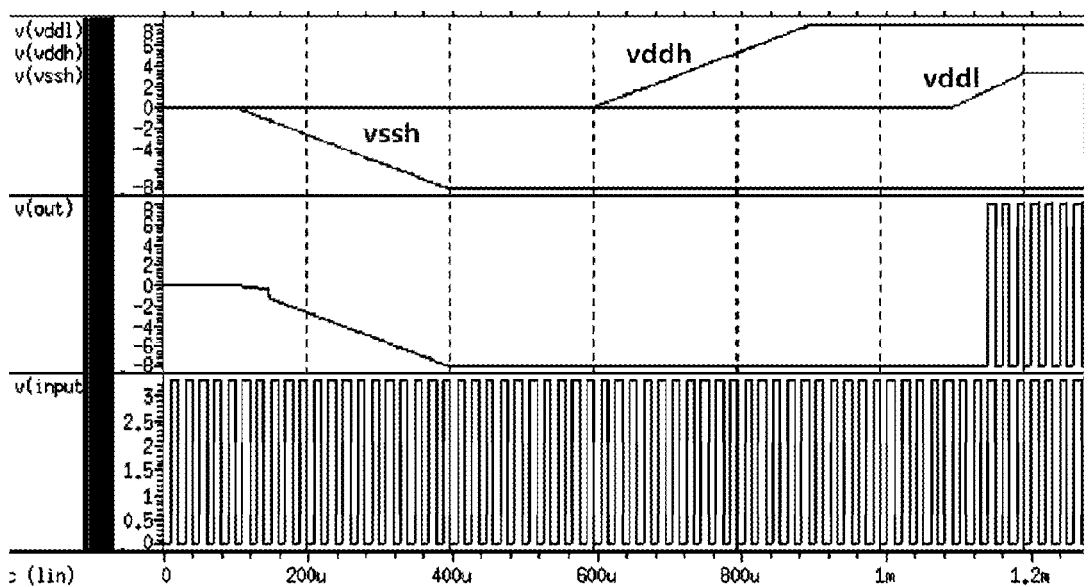
Figure 6A:
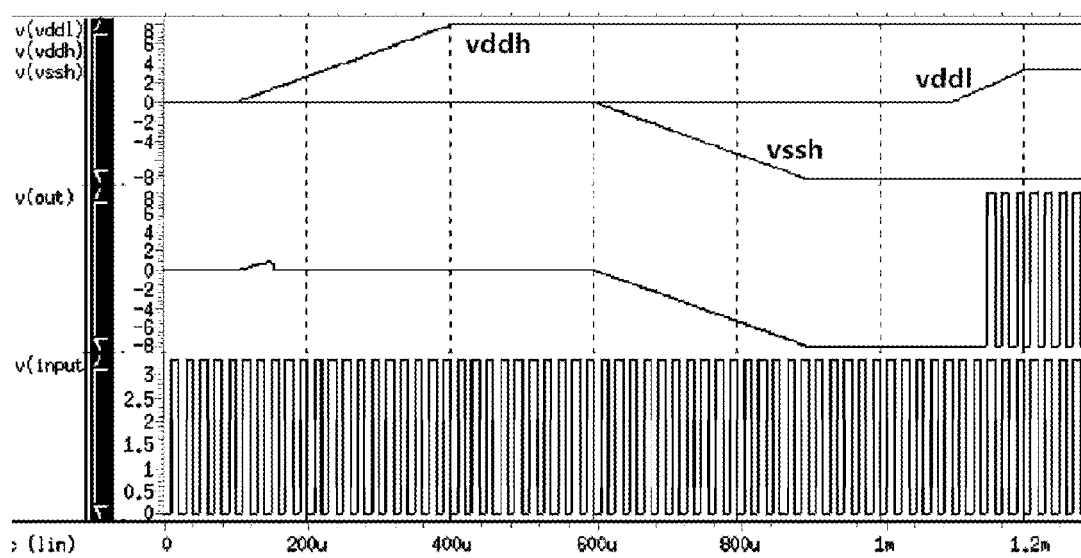
FIGS. 6A and 6B are simulation results when the second power supply VDDH, the third power supply VSSH and the first power supply VDDL are sequentially applied according to the example.
Figure 6B:
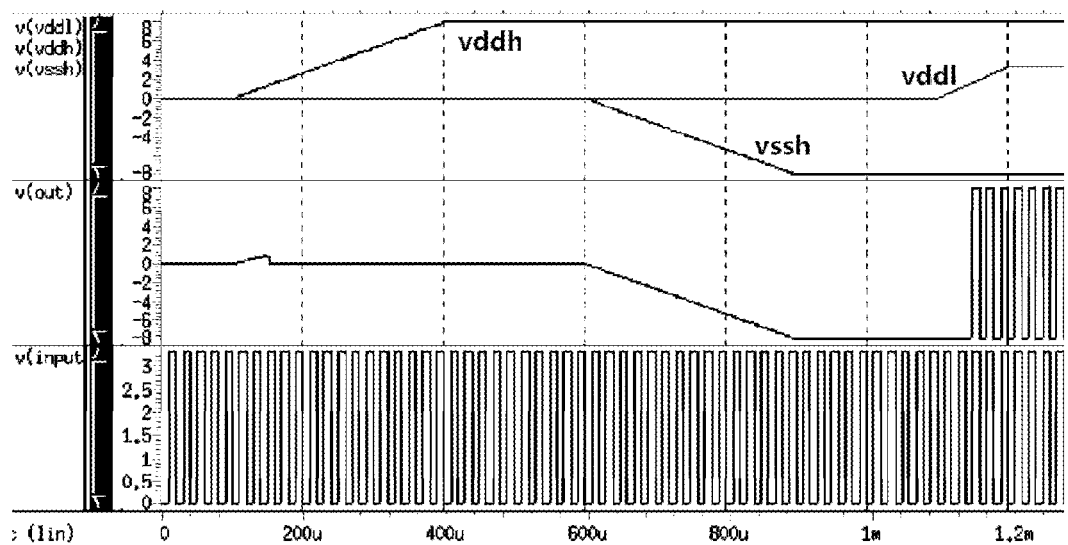

The simulation results are shown in FIGS. 5A and 5B and 6A and 6B. FIGS. 5A and 5B illustrate a simulation of the case where the third power supply (VSSH), the second power supply (VDDH) and the first power supply (VDDL) are sequentially applied according to the present embodiment. FIGS. 6A and 6B illustrate a case where the second power supply (VDDH), the third power supply (VSSH) and the first power supply (VDDL) are sequentially applied according to the present embodiment. FIG. 5A and FIG. 6A show simulation results when characteristics of MOS devices included in the level shifter are all the same. FIG. 5B and FIG. 6B show simulation results when voltage threshold values Vth of the MOS devices are changed.

As shown in FIGS. 5A and 5B and 6A and 6B, the simulations illustrate that all output voltages are output in the same state. Hence, in this example, even when the power supplies are applied in a different power-on sequence, the output voltages of the level shifter 100 are output at a constant value.

Additionally, even when the third power supply (VSSH) and the second power supply (VDDH) are simultaneously applied before the first power supply is applied, in the present embodiment obtains, the same results as the simulation results of FIGS. 5A and 5B and 6A and 6B are obtained.

When the third power supply (VSSH) and the second power supply (VDDH) are simultaneously applied, due to the turned-on operation of the NM 13 and the pull-up driving of the PM 15 in the first detecting unit 130, the node a and the node b of the first level shifter 110 are respectively set to be at a high level and a low level. Simultaneously, due to the turned-on operation of the PM 24 and the pull-down driving of the NM 24 in the second detecting unit 140, the node c and the node d of the second level shifter 120 are respectively set to be at a lower level and a high level.

As a result, the level shifter 100 inverts the voltage level of the V4 in the high-level state to a low-level state by the PM 5 and the NM 5 acting as inverters and outputs the voltage level of the V4 in the low-level state.

Figure 7B:
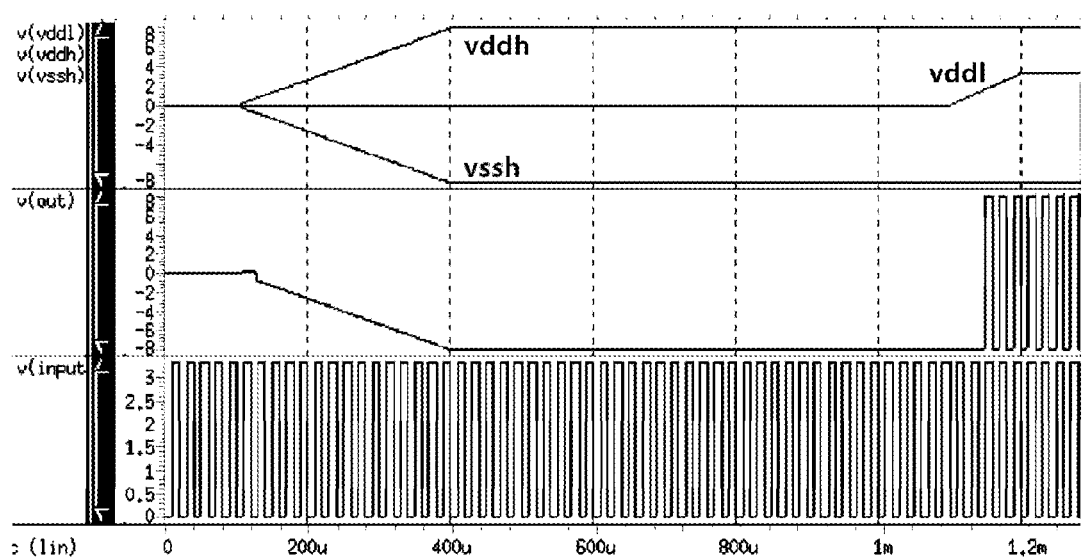

The simulation results when the third power supply VSSH and the second power supply VDDH are simultaneously applied are illustrated in FIGS. 7A and 7B. The simulation results of FIGS. 7A and 7B are the same as those of FIGS. 5A and 5B and 6A and 6B, such as in that the output voltages of the level shifter 100 are output at a constant value.

Figure 8:
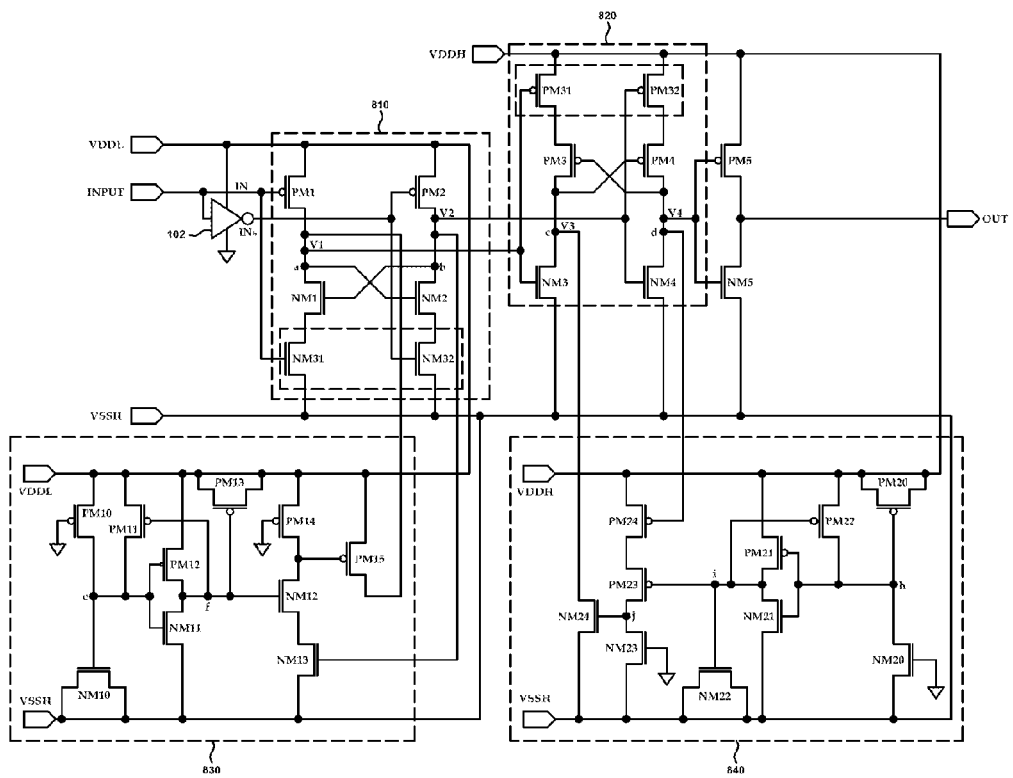
FIG. 8 is a circuit configuration diagram of a multi power supply type level shifter according to another example.

FIG. 8 is a circuit configuration diagram of a multi power supply type level shifter according to another example.

The configurations of the first and second level shifters 810 and 820 of the multi power supply level shifter of FIG. 8 are slightly different from the corresponding first and second level shifters 110 and 120 of the level shifter of FIG. 3. However, the first and second detecting units 830 and 840 of FIG. 8 are the same as the corresponding first and second detecting units 130 and 140 of the level shifter of FIG. 3.

Thus, while the first level shifter 110 and the second level shifter 120 in FIG. 3 each have four MOSs, the first level shifter 810 and the second level shifter 820 in FIG. 8 each have six MOSs by further providing a NM 31 and a NM 32 that execute a self-bias function in the first level shifter 810 and a PM 31 and a PM 32 that execute a self-bias function in the second level shifter 820.

In FIG. 8, the NM 31 and the NM 32 are respectively provided between the NM 1 and the third power supply (VSSH) and between the NM 2 and the third power supply (VSSH). Similarly, the PM 31 and the PM 32 are respectively provided between the PM 3 and the second power supply (VDDH) and between the PM 4 and the second power supply (VDDH).

In this manner, in the example of the two-stage level shifter each having six MOSs illustrated in FIG. 8, when the third power supply (VSSH) or the second power supply (VDDH) is applied before the first power supply (VDDL) is applied, the node a, the node b, the node c, and the node d are respectively set to be a high level, a low level, a low level, and a high level.

Meanwhile, the positions of the NM 31 and the NM 32 in the first level shifter 110 and the positions of the PM 31 and the PM 32 in the second level shifter 120 can be changed. FIG.

9 illustrates a structure of a multi power supply type level shifter according to still another example.

Figure 9:
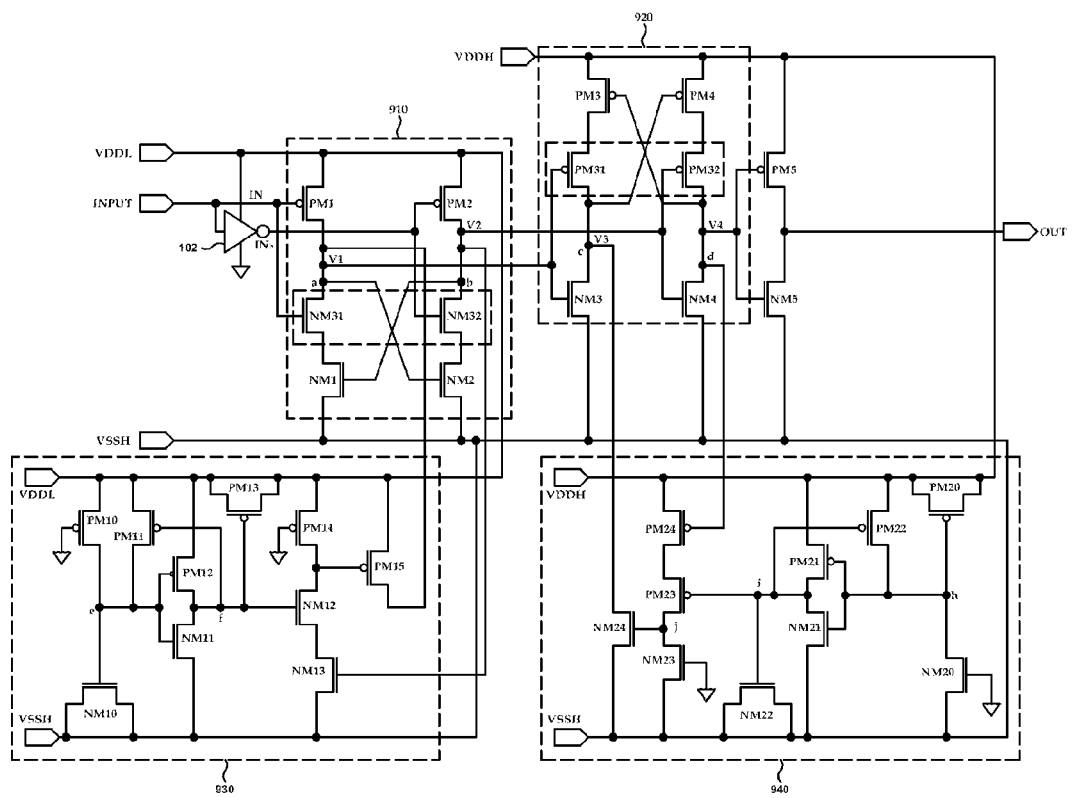
FIG. 9 is a circuit configuration diagram of a multi power supply type level shifter according to still another example.

Referring to FIG. 9, the NM 31, the NM 32, the PM 31 and the PM 32 that execute a self-bias function as discussed with reference to FIG. 8 are respectively provided between the PM 1 and the NM 1, between the PM 2 and the NM 2, between the PM 3 and the NM 3, and between the PM 4 and the NM 4.

In such a case, the node a and the node b are set to be preset levels, and the same detailed descriptions thereof as those in other examples are omitted for brevity.

As described above, in the examples, even when a power-on sequence of a two-stage multi power supply type level shifter using the VDDL, VDDH, and VSSH is changed, the output voltages of the level shifter is constantly output at a constant level, and the MOS devices of the two-stage level shifter are simultaneously turned on to prevent short-circuit currents from being generated.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multi power supply type level shifter comprising:
    a first level shifter situated between a first power supply and a third power supply and configured to output a first voltage level and a second voltage level through a node a and a node b, respectively, depending on an input signal;
    a second level shifter situated between a second power supply and the third power supply and configured to output a third voltage level and a fourth voltage level through a node c and a node d, respectively, depending on the first voltage level and the second voltage level; and
    a detecting unit configured to detect whether the third power supply is applied to the first level shifter before the first power supply is applied, wherein in response to the third power supply being applied before the first power supply is applied, the detecting unit is configured to cause the first voltage level of the node a and the second voltage level of the node b to enter a high-level state and a low-level state, respectively.

2. The multi power supply type level shifter of claim 1, wherein in response to the second power supply being applied to the second level shifter, the node c and the node d are configured to enter a low-level state and a high-level state depending on the first voltage level and the second voltage level, respectively.

3. The multi power supply type level shifter of claim 1, further comprising:
an output unit configured to receive a fourth voltage level in the high-level state from the node d, inverts a state of the received fourth voltage level to a low-level state, and configured to output the fourth voltage level in the low-level state.

4. The multi power supply type level shifter of claim 1, wherein the detecting unit comprises a plurality of switching devices that are maintained at a turned-off state in response to the third power supply being applied and are turned on depending on the second voltage level of the node b.

5. The multi power supply type level shifter of claim 4, wherein the detecting unit further comprises
a first metal-oxide semiconductor (MOS) configured to detect the second voltage level of the node b,
a second MOS that is connected to the first MOS and has a gate voltage of a ground (GND) level, and
a third MOS that is connected to the second MOS and is pull-up driven so as to allow the node a to enter a high-level state in response to the first MOS and the second MOS being turned on.

6. The multi power supply type level shifter of claim 5, wherein the first MOS and the second MOS are turned on in response to the second voltage level of the node b being equal to or greater than a threshold value of the first MOS.

7. The multi power supply type level shifter of claim 6, wherein among the first power supply, the second power supply and the third power supply, the second power supply has the highest voltage level, and the third power supply has the lowest voltage level.

8. The multi power supply type level shifter of claim 7, wherein the first power supply is a lower supply voltage VDDL, the second power supply is a higher supply voltage VDDH, and the third power supply is a reference voltage VSSH.

9. A multi power supply type level shifter comprising:
a first level shifter situated between a first power supply and a third power supply and configured to output a first voltage level and a second voltage level through a node a and a node b, respectively, depending on an input signal;
a second level shifter situated between a second power supply and the third power supply and configured to output a third voltage level and a fourth voltage level through a node c and a node d, respectively, depending on the first voltage level and the second voltage level; and
a detecting unit configured to detect whether the second power supply is applied to the second level shifter before the third power supply is applied, wherein in response to the second power supply being applied before the third power supply is applied, the detecting unit is configured to cause the third voltage level of the node c and the fourth voltage level of the node d to enter a low-level state and a high-level state, respectively.

10. The multi power supply type level shifter of claim 9, further comprising:
an output unit configured to receive the fourth voltage level in the high-level state through the node d, inverts a state of the received fourth voltage level to a low-level state, and configured to output the fourth voltage level in the low-level state.

11. The multi power supply type level shifter of claim 10, wherein the detecting unit comprises
a first P-type metal oxide semiconductor (PMOS) that is connected to the node d,
a second PMOS that is connected to the first PMOS and has a gate voltage of a ground (GND) level, and
a first N-type metal oxide semiconductor (NMOS) that is connected to the second PMOS and is pull-down driven so as to allow the node c to enter a low-level state in response to the first PMOS and the second PMOS being turned on.

12. The multi power supply type level shifter of claim 11, wherein in response to the third voltage level of the node c being equal to or less than a threshold value of the first PMOS, the first PMOS, the second PMOS and the first NMOS are turned on.

13. The multi power supply type level shifter of claim 12, wherein among the first power supply, the second power supply and the third power supply, the second power supply has the highest voltage level, and the third power supply has the lowest voltage level.

14. The multi power supply type level shifter of claim 13, wherein the first power supply is a lower supply voltage VDDL, the second power supply is a higher supply voltage VDDH, and the third power supply is a reference voltage VSSH.

15. A multi power supply type level shifter comprising a first level shifter and a second level shifter in two stages that selectively receive first, second, and third power supplies and change a signal level, comprising:
a first detecting unit configured to detect that the first power supply is applied when the third power supply is previously applied to the first level shifter and in response, configured to cause the first level shifter to output a first voltage level in a high-level state and a second voltage level in a low-level state, and
a second detecting unit configured to detect that third power supply is applied when the second power supply is previously applied to the second level shifter and in response, configured to cause the second level shifter to output a third voltage level in a low-level state and a fourth voltage level in a high-level state.

16. The multi power supply type level shifter of claim 15, wherein the first power supply is a lower supply voltage VDDL, the second power supply is a higher supply voltage VDDH, and the third power supply is a reference voltage VSSH.

17. The multi power supply type level shifter of claim 16, wherein the first detecting unit comprises a plurality of switching devices that are maintained in a turned-off state in response to the third power supply being applied and are turned on depending on the second voltage level of a node b.

18. The multi power supply type level shifter of claim 17, wherein the second detecting unit comprising
a first metal-oxide semiconductor (MOS) configured to detect the second voltage level of the node b,
a second MOS that is connected to the first MOS and has a gate voltage of a ground (GND) level, and
a third MOS that is connected to the second MOS and is pull-up driven to allow a node a to enter a high-level state in response to the first MOS and the second MOS being turned on, and
the first MOS and the second MOS are turned on in response to the second voltage level of the node b being equal to or greater than a threshold value of the first MOS.

19. The multi power supply type level shifter of claim 16, wherein the second detecting unit comprises
a first PMOS that is connected to a node d,
a second PMOS that is connected to the first PMOS and has a gate voltage of a ground (GND) level, and
a first NMOS that is connected to the second PMOS and is pull-down driven so as to allow a node c to enter a low-level state in response to the first PMOS and the second PMOS being turned on.

20. The multi power supply type level shifter of claim 19, wherein in response to the third voltage level of the node c being equal to or less than a threshold value of the first PMOS, the first PMOS, the second PMOS and the first NMOS are turned on.

21. The multi power supply type level shifter of claim 15, wherein at least one of the first level shifter and the second level shifter is configured to execute a self-bias function.

22. A multi power supply type level shifter comprising:
a first level shifter situated between a first power supply and a third power supply configured to output a first voltage level and a second voltage level, depending on an input signal;
a second level shifter situated between a second power supply and the third power supply configured to output a third voltage level and a fourth voltage level, depending on the first voltage level and the second voltage level;
a detecting unit configured to detect when a power supply is applied out of order, wherein in response to detecting that a power supply is applied out of order, the detecting unit is configured to control one or more of the first voltage level, the second voltage level, the third voltage level, and the fourth voltage level.

23. The multi power supply type level shifter of claim 22, wherein in response to detecting that the third power supply being applied before the first power supply is applied, the detecting unit is configured to cause the first voltage level and the second voltage level to enter a high-level state and a low-level state, respectively.

24. The multi power supply type level shifter of claim 22, wherein in response to detecting that the second power supply being applied before the third power supply is applied, the detecting unit is configured to cause the third voltage level and the fourth voltage level to enter a low-level state and a high-level state, respectively.

25. The multi power supply type level shifter of claim 22, further comprising an output unit configured to receive the fourth voltage level in the high-level state, inverts a state of the received fourth voltage level to a low-level state, and configured to output the fourth voltage level in the low-level state.

* * * * *